United States Patent
König et al.

(10) Patent No.: US 11,245,334 B2
(45) Date of Patent: Feb. 8, 2022

(54) ENERGY ACCUMULATOR EMULATOR AND METHOD FOR EMULATION OF AN ENERGY ACCUMULATOR (71) Applicant: AVL LIST GMBH, Graz (AT)

(72) Inventors: Oliver König, Graz (AT); Wolfgang Falmbigl, Vienna (AT); Stefan Jakubek, Vienna (AT); Alexander Eder, Höf-Präbach (AT); Günter Prochart, Graz (AT)

(73) Assignee: AVL List GmbH, Graz (AT)

(*) Notice: Subject to any disclaimer, the term of this patent is extended or adjusted under 35 U.S.C. 154(b) by 38 days.

(21) Appl. No.: 16/643,970

(22) PCT Filed: Aug. 31, 2018

(86) PCT No.: PCT/EP2018/073422
§ 371 (c)(1),
(2) Date: Mar. 3, 2020

(87) PCT Pub. No.: WO2019/043136
PCT Pub. Date: Mar. 7, 2019

(65) Prior Publication Data
US 2020/0412249 A1 Dec. 31, 2020

(30) Foreign Application Priority Data
Sep. 4, 2017 (AT) .............................. A 50742/2017

(51) Int. Cl.
*H02M 3/158* (2006.01)
*G01R 31/367* (2019.01)
(Continued)

(52) U.S. Cl.
CPC ........ *H02M 3/1584* (2013.01); *G01R 31/367* (2019.01); *G01R 31/3644* (2013.01); *H02M 3/137* (2013.01)

(58) Field of Classification Search
CPC .... H02J 2310/48; H02J 3/322; H02M 3/1584; H02M 3/156; H02M 7/521; H02M 7/5387; G01R 31/367
See application file for complete search history.

(56) References Cited

U.S. PATENT DOCUMENTS

2007/0241732 A1    10/2007  Luo et al.
2014/0049215 A1*    2/2014  Fassnacht ............. H02J 7/1423
                                                           320/109

(Continued)

FOREIGN PATENT DOCUMENTS

EP      2863528 A1    4/2015
GB      2472111 A     1/2011
WO      2013135741 A1 9/2019

OTHER PUBLICATIONS

König Oliver et al: "Model predictive control of a DC-DC converter for battery emula", Control Engineering Practice, Pergamon Press, Oxford, GB, vol. 21, No. 4, Jan. 31, 2013 (Jan. 31, 2013), pp. 428-440, XP028980413, ISSN: 0967-0661, DOI: 10.1016/J.CONENGPRAC.2012.12.009.

*Primary Examiner* — Alex Torres-Rivera
(74) *Attorney, Agent, or Firm* — Dykema Gossett PLLC (57) ABSTRACT

Various aspects of the present disclosure are directed to energy accumulator emulators. In one embodiment, an energy accumulator emulator is disclosed including a DC-to-DC converter having a number of power switches, a control unit that calculates a reference current from electrical variables of the DC-to-DC converter, and a battery model connected to the control unit. The battery model receives and processes the reference current and communicates a referenced voltage to the control unit. The control unit includes a voltage controller that processes the reference voltage and controls a current, on the basis of which the control unit controls the power switches via switching pulses (Continued)

to control an output voltage. The energy accumulator emulator further includes a PPPC unit that is connected to the voltage controller. The PPPC unit provides a number of pulse patterns, selects a pulse pattern, and controls the power switches according to the selected pulse pattern.

16 Claims, 4 Drawing Sheets

(51) Int. Cl.
 *G01R 31/36* (2020.01)
 *H02M 3/137* (2006.01)

(56) References Cited

U.S. PATENT DOCUMENTS

| | | |
|---|---|---|
| 2015/0112620 A1 | 4/2015 | Konig et al. |
| 2015/0143885 A1 | 5/2015 | Konig et al. |
| 2017/0170729 A1 | 6/2017 | Jung et al. |
| 2017/0227937 A1 | 8/2017 | Batliner et al. |
| 2018/0017630 A1 | 1/2018 | Schipfer |
| 2019/0011941 A1* | 1/2019 | Konig .................. G01M 15/02 |

* cited by examiner

| | A | | | | B | | | | C | | | | D | | | |
|---|---|---|---|---|---|---|---|---|---|---|---|---|---|---|---|---|
| | $S_1$ | $S_2$ | $S_3$ | $S_4$ | $S_1$ | $S_2$ | $S_3$ | $S_4$ | $S_1$ | $S_2$ | $S_3$ | $S_4$ | $S_1$ | $S_2$ | $S_3$ | $S_4$ |
| $t_k < t \le t_1$ | 1 | 0 | 0 | 0 | 1 | 0 | 0 | 0 | 1 | 1 | 0 | 0 | 1 | 1 | 1 | 0 |
| $t_1 < t \le t_2$ | 0 | 0 | 0 | 0 | 1 | 1 | 0 | 0 | 1 | 1 | 1 | 0 | 1 | 1 | 1 | 1 |
| $t_2 < t \le t_3$ | 0 | 1 | 0 | 0 | 0 | 1 | 0 | 0 | 0 | 1 | 1 | 0 | 0 | 1 | 1 | 1 |
| $t_3 < t \le t_4$ | 0 | 0 | 0 | 0 | 0 | 0 | 1 | 0 | 0 | 0 | 1 | 1 | 1 | 0 | 1 | 1 |
| $t_4 < t \le t_5$ | 0 | 0 | 1 | 0 | 0 | 0 | 1 | 0 | 0 | 0 | 1 | 1 | 1 | 1 | 1 | 1 |
| $t_5 < t \le t_6$ | 0 | 0 | 0 | 1 | 0 | 0 | 0 | 1 | 1 | 0 | 0 | 1 | 1 | 1 | 0 | 1 |
| $t_6 < t \le t_7$ | 0 | 0 | 0 | 0 | 1 | 0 | 0 | 1 | 1 | 1 | 0 | 1 | 1 | 1 | 1 | 1 |

ENERGY ACCUMULATOR EMULATOR AND METHOD FOR EMULATION OF AN ENERGY ACCUMULATOR

CROSS-REFERENCE TO RELATED APPLICATIONS

This application is a national stage filing based upon International PCT Application No. PCT/EP2018/073422, filed 31 Aug. 2018, which claims the benefit of priority to Austria application No. A 50742/2017, filed 4 Sep. 2017.

BACKGROUND

The present invention relates to an energy accumulator emulator consisting of a DC-to-DC converter having a number of power switches, the DC-to-DC converter providing an output voltage and an output-side load current, a control unit which is designed to calculate a reference current from electrical variables of the DC-to-DC converter and a battery model, which is connected to the control unit and is configured to obtain and process the reference current and to provide the control unit with the reference voltage, wherein a voltage controller is provided in the control unit, which processes the reference voltage and controls a current on the basis of which the control unit controls the power switches via switching pulses to control the output voltage. Furthermore, the present invention relates to a method for emulation of an energy accumulator device, wherein an output voltage of a DC-to-DC converter is controlled by means of a controller which calculates a reference current from electrical variables of the DC-to-DC converter as well as a reference voltage and transmits it to a battery model, wherein the battery model processes the reference current, calculates the resulting reference voltage and transmits it to the voltage controller, which processes the reference voltage and controls a current on the basis of which the control unit controls the power switches via switching pulses to control the output voltage.

In the development of electrical energy accumulators, in particular traction batteries or battery packs for hybrid or electric vehicles, energy accumulator emulators which emulate the real behavior of an energy accumulator play an important role. Such energy accumulators are very expensive, which is why it is advantageous to emulate the energy accumulator and to carry out the development work or tests on the emulation. In addition, it is possible that the energy accumulator is not yet available in the early stages of development, which is why an emulation must be used as well. An energy accumulator emulator comprises an energy accumulator model that calculates the output voltage from a power requirement, for example a desired current, and adjusts it at the output of the energy accumulator emulator to reflect what would occur in the real battery. Depending on the complexity and type of the energy accumulator model, various influencing factors such as the load, the temperature, the state of charge (SoC), the battery chemistry, etc., can be taken into account.

Such an energy accumulator emulator is described, for example, in AT 510 998 A2 and AT 513 676 A2. An energy accumulator emulator generally generates an output voltage on the basis of a load current. For this purpose, the load current is measured, converted into a reference current via a control unit and provided to a battery model. The battery model calculates a reference voltage from the reference current. The control unit controls the output voltage on the basis of this reference voltage, which is supplied to an electrical load.

For this purpose, power electronics in the form of a DC-to-DC converter is typically implemented in the energy accumulator emulator, which provides the required output voltage or the required load current. The switches of the DC-to-DC converter are controlled by the control unit to set the desired output voltage or the desired load current. A pulse width modulation (PWM), which is sufficiently known, is generally provided in the control unit in order to set the output voltage via the duty cycle of the switches. In a PWM, the switches are switched one time at each sampling time, which specified by a specific sampling rate. The maximum sampling rate therefore depends on the permissible frequency with which the switches, usually bipolar transistors with an insulated gate electrode (IGBT) or metal oxide semiconductor field effect transistors (MOSFET), can be switched. However, the frequency with which the switches can be switched is also limited by the switching losses that occur during the switching process. Since the PWM switches with every sampling step, this constraint also limits the sampling rate and thus the controller bandwidth. This constraint leads to poor dynamics in the control of such converters since it is often not possible to react quickly enough to interferences or transient switching operations of the load, which requires transient voltage jumps. A sampling rate increase in the form of oversampling is possible but only under severe restrictions, which is why oversampling has no practical relevance for the control of the DC-to-DC converter.

To avoid this disadvantage of a PWM, a so-called finite control set model predictive control (FCS-MPC) is known as a control strategy. With this control strategy, the switches are controlled directly, eliminating the need for a PWM. This can also increase the sampling rate and improve the dynamics of the control. Such methods for a direct control of the switches in power electronic systems are not new. An overview of this can be found for example in J. Rodriguez, et al., "*State of the art of finite control set model predictive control in power electronics,*" Industrial Informatics, IEEE Transactions, 9 (2): 1003-1016, May 2013. This control strategy is used for controlling an electrical machine in EP 2 528 225 B1, for example. FCS-MPC is characterized by the limited number of options for the manipulated variable, the so-called finite control set.

WO 2013/174967 A1 describes a model-predictive control method for a battery emulator, and WO 2013/174972 A1 describes a model-predictive control method for a battery tester. It provides a general explanation of the model-predictive control method and a more specific method with which the optimization problem can be solved quickly enough to allow for sampling rates in the kHz range. The DC-to-DC converter is, however, once again controlled by means of a PWM with all the disadvantages explained above, in particular the limitation of the sampling rate.

AT 513 776 B1 discloses a method for a model-predictive control of a DC-to-DC converter with which the optimization problem can be solved quickly enough, even in the event of large prediction horizons. For this purpose, the optimization problem of model-predictive control is divided into two optimization problems by implementing a model-predictive output variable controller and a model-predictive choke current controller in the control unit, with the strands of the multiphase DC-to-DC converter being combined into a single phase for the output variable controller and time-discrete state space model being created from this phase.

The output variable controller predicts the input voltage of the next sampling step for this single phase based on a first cost function of the optimization problem of the output variable controller, which is then provided to the choke current controller as a default. The choke current controller then uses this information to determine the necessary switch positions of the switches of the phases of the multiphase DC-to-DC converter for the next sampling step on the basis of a second cost function of the optimization problem of the choke current controller. By dividing the controller into two model-predictive, cascaded sub-controllers, the order of the state space model is reduced, which also reduces the finite control set of the model-predictive control. Solutions for the optimization problem can therefore be found more quickly by using the approach according to the invention, which makes it possible to also use larger prediction horizons with high sampling rates. This method does, however, depend on a clock frequency as well, which limits the dynamics of the control.

SUMMARY OF THE INVENTION

It is therefore object of the present invention to provide an energy accumulator emulator which has greater dynamics and flexibility in controlling the output voltage.

The invention achieves this object with a PPPC unit provided in the energy accumulator emulator, which is connected to the voltage controller and which comprises a PPPC controller, a pulse generator and a selection unit which provides a number of pulse patterns, with the PPPC controller being configured to select a pulse pattern of the selection unit on the basis of the current obtained from the voltage controller and to control the power switches via the pulse generator by means of switching pulses according to this pulse pattern. Furthermore, the object is achieved by a method for controlling an output voltage of a DC-to-DC converter of an energy accumulator emulator, wherein a PPPC unit selects a pulse pattern from a number of predetermined pulse patterns on the basis of the current controlled by the voltage controller and controls the power switches of the DC-to-DC control converter according to the selected pulse pattern to control the output voltage. This means that a predictive pulse pattern control (PPPC) can be freely selected from available pulse patterns, which leads to higher dynamics and accuracy in the control of the output voltage.

Advantageously, the PPPC unit also specifies the switching times of the selected pulse pattern of the power switches based on the reference voltage PPPC unit based on the current. In addition to the pulse patterns, the times of the switching pulses can also be freely defined, thus achieving even greater flexibility.

BRIEF DESCRIPTION OF THE DRAWINGS

The present invention is described in greater detail below on the basis of FIGS. 1 to 3b, which show advantageous exemplary embodiments of the invention in a schematic and non-limiting manner. Figures.

DETAILED DESCRIPTION

Figure 1:
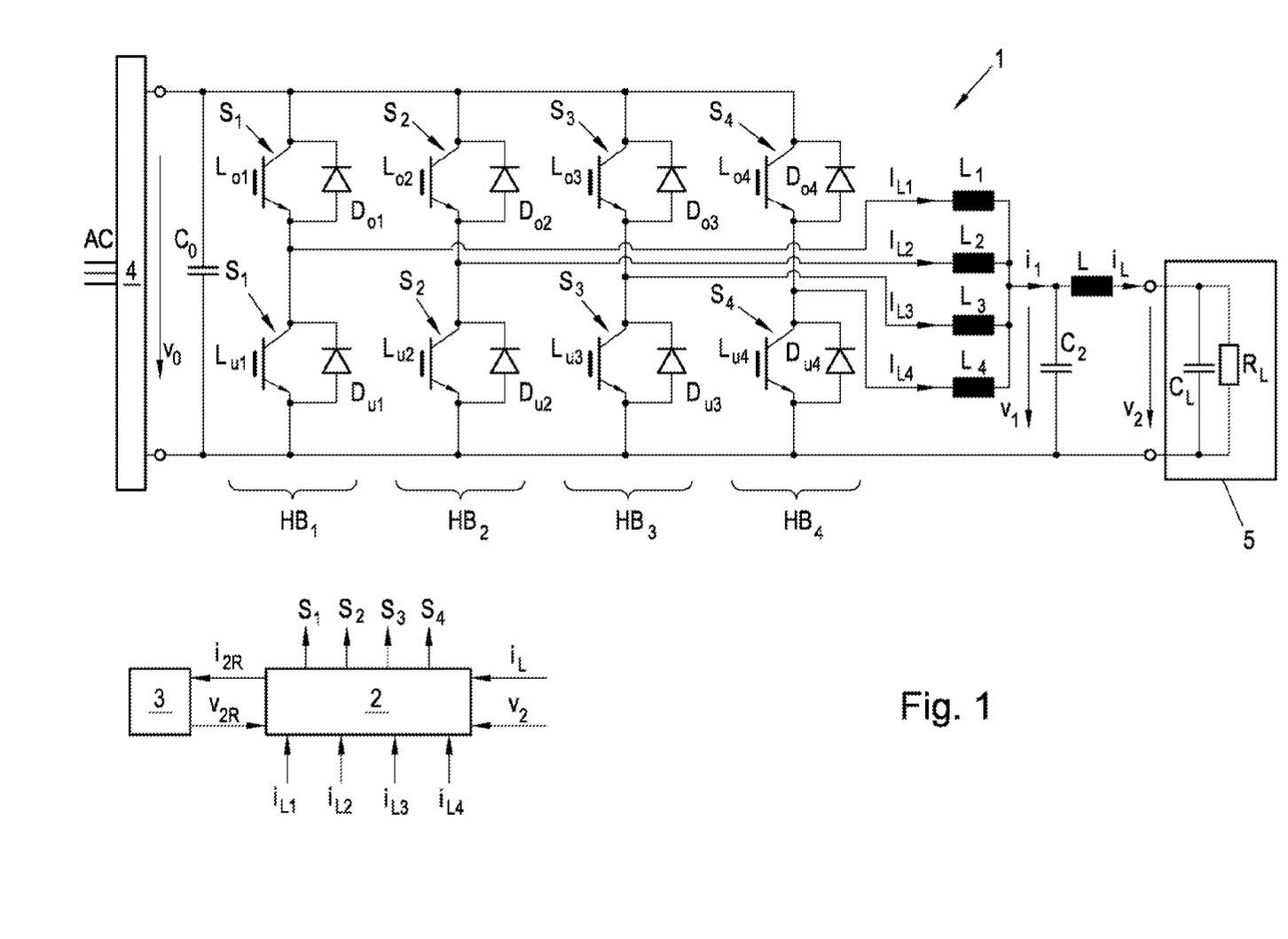
FIG. 1 shows an energy accumulator emulator.

FIG. 1 discloses a possible configuration of an energy accumulator emulator which provides an electrical load 5, for example a (partially) electrical drive train of a vehicle, with an output voltage $v_2$ or a load current $i_L$. The electrical load 5 is modeled here, for example, by a load capacitance $C_L$ and a load resistor $R_L$. For this purpose, for example, the load current $i_L$ and the output voltage $v_2$ are determined and provided to a control unit 2, which in turn calculates a reference current $i_{2R}$ for a battery model 3 from the load current $i_L$ and provides it to the battery model 3. This conversion depends, of course, on the type of battery model 3. The battery model 3 calculates a reference voltage $v_{2R}$ from the load current $i_L$ and supplies it to the control unit 2, which, on this basis, controls the power switches $S_{o1}$, $S_{o2}$, $S_{o3}$, $S_{o4}$, $S_{u1}$, $S_{u2}$, $S_{u3}$, $S_{u4}$ of a well-known multi-phase DC-to-DC converter 1 via the binary switching pulses $S_1$, $S_2$, $S_3$, $S_4$.

A basic exemplary structure of a battery model 3 can be found, for example, in AT 510 998 A2 or AT 513 676 A2.

The DC-to-DC converter 1 generates the required output voltage $v_2$ and provides it to the load 5. On the input side, for example, a three-phase AC voltage is rectified by means of a rectifier 4 and a smoothing capacitor Co to form a DC voltage $v_0$. The smoothing capacitor Co is assumed to be sufficiently large so that the dynamics of the rectifier 4 can be neglected, and the DC voltage $v_0$ can be assumed to be constant. The DC voltage $v_0$ supplies the DC-to-DC converter 1.

In this exemplary embodiment, the DC-to-DC converter 1 is in the form of a four-phase synchronous converter, consisting of parallel half bridges $HB_1$, $HB_2$, $HB_3$, $HB_4$ and associated chokes, L1, L2, L3, L4, whose phase currents $i_{L1}$, $i_{L2}$, $i_{L3}$, $i_{L4}$ are each controlled by the switching behavior of the associated half-bridge $HB_1$, $HB_2$, $HB_3$, $HB_4$. The half bridges $HB_1$, $HB_2$, $HB_3$, $HB_4$ each consist of an upper power switch $S_{o1}$, $S_{o2}$, $S_{o3}$, $S_{o4}$ and a lower power switch $S_{u1}$, $S_{u2}$, $S_{u3}$, $S_{u4}$ and any associated freewheeling diodes $D_{o1}$, $D_{u1}$, $D_{o2}$, $D_{u2}$, $D_{o3}$, $D_{u3}$, $D_{o4}$, $D_{u4}$. One half bridge $HB_1$, $HB_2$, $HB_3$, $HB_4$ and one inductor $L_1$, $L_2$, $L_3$, $L_4$ each are thus provided per phase, the inductors $L_1$, $L_2$, $L_3$, $L_4$ being connected to a half bridge $HB_1$, $HB_2$, $HB_3$, $HB_4$ between the upper power switches $S_{o1}$, $S_{o2}$, $S_{o3}$, $S_{o4}$ on the one hand and the lower power switches $S_{u1}$, $S_{u2}$, $S_{u3}$, $S_{o4}$ on the other hand and furthermore to one another on the output side. The output current $i_1$ is thus the sum of the phase currents $i_{L1}$, $i_{L2}$, $i_{L3}$, $i_{L4}$. Ohmic resistances of the chokes $L_1$, $L_2$, $L_3$, $L_4$ are not shown in FIG. 1 for the sake of simplicity but can also be taken into account. In addition, there is usually an output-side smoothing capacitor $C_2$ which, together with the chokes $L_1$, $L_2$, $L_3$, $L_4$ and the output inductance L, forms an output filter of the synchronous converter. This filter receives the output current $i_1$ or an intermediate voltage $v_1$ at the input and also supplies an output voltage $v_2$ and thus a load current $i_L$. The DC-to-DC converter 1 can, of course, also be configured as a different embodiment, for example with fewer or more phases, etc.

The power switches $S_{o1}$, $S_{o2}$, $S_{o3}$, $S_{o4}$, $S_{u1}$, $S_{u2}$, $S_{u3}$, $S_{u4}$ of the half bridges are controlled by a control unit 2 in order to set the desired output voltage $v_2$, which results in the required load current $i_L$. The upper power switches $S_{o1}$, $S_{o2}$, $S_{o3}$, $S_{o4}$ and the respectively associated lower power switches $S_{u1}$, $S_{u2}$, $S_{u3}$, $S_{u4}$ of a half bridge $HB_1$, $HB_2$, $HB_3$, $HB_4$ are switched in an alternating order to prevent a short circuit. The basic control of half bridges $HB_1$, $HB_2$, $HB_3$, $HB_4$ of a synchronous converter for generating the load current $i_L$ can be assumed as known.

Usually, prior art provides for an equally well known pulse width modulation (PWM) in the control unit 2 in order to use the duty cycle of the power switches $S_{o1}$, $S_{o2}$, $S_{o3}$, $S_{o4}$, $S_{u1}$, $S_{u2}$, $S_{u3}$, $S_{u4}$ to set the output voltage $v_2$ or the desired load current $i_L$ via the phase currents $i_{L1}$, $i_{L2}$, $i_{L3}$, $i_{L4}$. Since a PWM switches with every sampling step, this constraint also limits the sampling rate and thus the controller bandwidth. This constraint leads to poor dynamics in the control of such DC-to-DC converters 1, which means that it is often not possible to react quickly enough to interferences or transient switching processes of the load 5.

Figure 2:
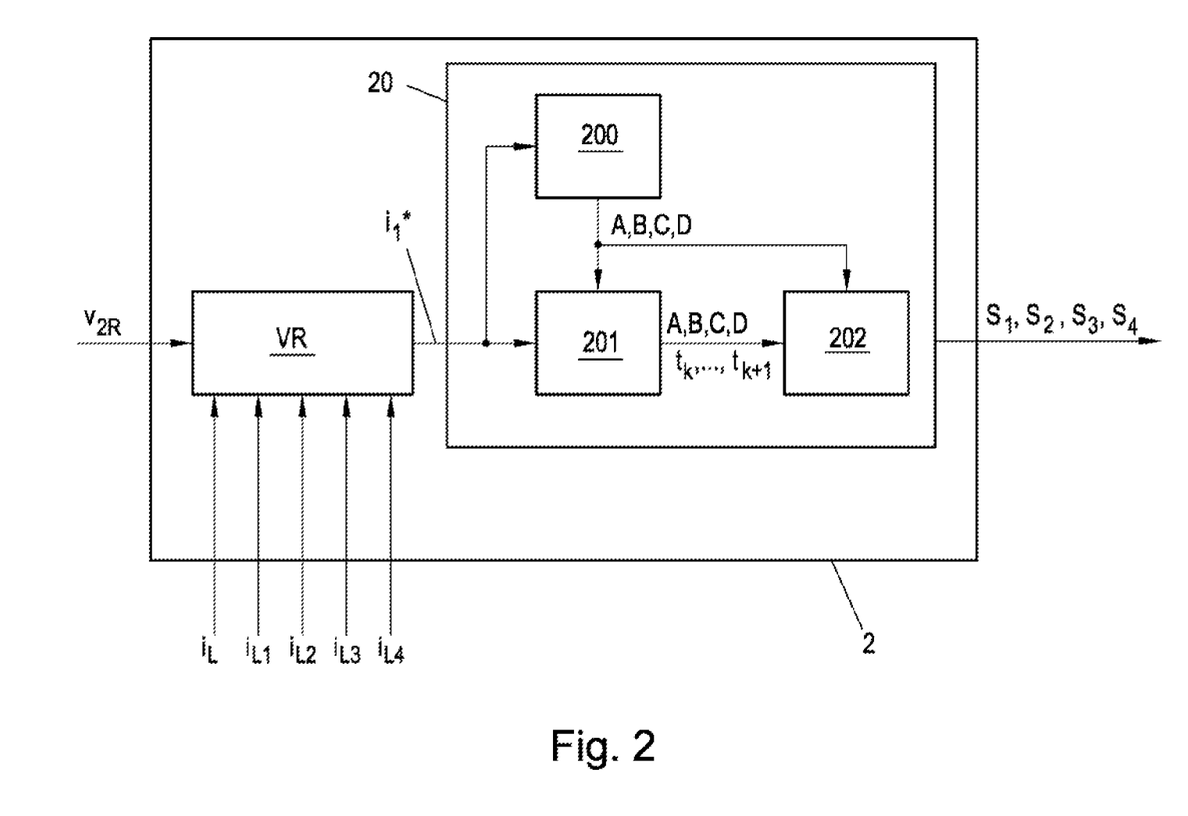
FIG. 2 shows a PCCC unit.

For this reason, the control unit 2 does not control the power switches $S_{o1}$, $S_{o2}$, $S_{o3}$, $S_{o4}$, $S_{u1}$, $S_{u2}$, $S_{u3}$, $S_{u4}$ on the basis of a PWM but, according to the invention, via a predictive pulse pattern control (PPPC). The control unit 2 also receives the string currents $i_{L1}$, $i_{L2}$, $i_{L3}$, $i_{L4}$ (which can be measured) as well as the current load current $i_L$ (which can be measured) and the current output voltage $v_2$ (which can be measured) as input variable. In order to achieve a faster and more precise adjustment of the output voltage $v_2$, a combination of an inner and an outer control loop as shown in FIG. 2 is used in the control unit 2.

The outer control loop has a voltage controller VR, which is superimposed on an inner control loop formed by a PPPC unit 20. The voltage controller VR receives the reference voltage $v_{2R}$ from the battery model 3 as well as further electrical variables of the battery emulator (for example the phase currents $i_{L1}$, $i_{L2}$, $i_{L3}$, $i_{L4}$, the output voltage $v_2$, the load current $i_L$, etc.) and controls a current $i_1^*$ on this basis. Any suitable controller can be implemented for this purpose. A possible control strategy for the voltage controller VR is a model-predictive controller (MPC), which minimizes the error between the actual output current $i_1$ (which is measured, for example) and the current $i_1^*$ set by the voltage controller VR across the prediction horizon $N_P$. In addition, a system-related limitation of the output current $i_1$ can be taken into account in the MPC as well. The variables required for the voltage controller VR are either measured and/or estimated on the basis of an observer, for example in the form of a Kalman filter) from measurable variables (preferably $i_1$, $i_2$, $v_1$, $v_2$, $i_{L1}$, $i_{L2}$, $i_{L3}$, $i_{L4}$, for example the load current $i_L$).

In turn, the PPPC unit 20 consists of a PPPC controller 201, a pulse generator 202 and a selection unit 200. The pulse generator 202 controls the power switches $S_{o1}$, $S_{o2}$, $S_{o3}$, $S_{o4}$, $S_{u1}$, $S_{u2}$, $S_{u3}$, $S_{u4}$ via switching pulses $S_1$, $S_2$, $S_3$, $S_4$ in order to set the desired phase currents $i_{L1}$, $i_{L2}$, $i_{L3}$, $i_{L4}$ and thus the desired load current $i_L$ or the desired output voltage $v_2$. The pulse generator 202 can select from various predefined pulse patterns A, B, C, D made available by the selection unit 200.

The PPPC controller 20 processes the current $i_1^*$ specified by the voltage controller VR and selects a suitable pulse pattern A, B, C, D provided by the selection unit 200 and the suitable switching times $t_1$, $t_2$, $t_3$, $t_4$, $t_5$, $t_6$, $t_7$, $t_{k+1}$ of the pulse patterns A, B, C, D, with which the pulse generator 202 controls the power switches $S_{o1}$, $S_{o2}$, $S_{o3}$, $S_{o4}$, $S_{u1}$, $S_{u2}$, $S_{u3}$, $S_{u4}$ via switching pulses $S_1$, $S_2$, $S_3$, $S_4$ in accordance with these pulse patterns A, B, C, D with corresponding switching times $t_1$, $t_2$, $t_3$, $t_4$, $t_5$, $t_6$, $t_7$, $t_{k+1}$.

Each pulse pattern A, B, C, D generates the switching pulses $S_1$, $S_2$, $S_3$, $S_4$ of each half bridge $HB_1$, $HB_2$, $HB_3$, $HB_4$ a sequence of switching pulses $S_1$, $S_2$, $S_3$, $S_4$ which ideally covers the entire possible range of the output voltage $v_2$. Thus, between two times $t_k$, $t_{k+1}$, which preferably correspond to a sampling period $T_P$, two switching actions per period, i.e., two changes from active to inactive, of the respective power switches $S_{o1}$, $S_{o2}$, $S_{o3}$, $S_{o4}$, $S_{u1}$, $S_{u2}$, $S_{u3}$, $S_{u4}$ are made possible, with the switching actions taking place at the freely selectable switching times $t_k$, $t_1$, $t_2$, $t_3$, $t_4$, $t_5$, $t_6$, $t_7$, $t_{k+1}$. The number of switching times can be freely selected. As usual, the required output current $i_1$ is thus generated as the sum of the phase currents $i_{L1}$, $i_{L2}$, $i_{L3}$, $i_{L4}$. By using a pulse generator 202, the switching pulses $S_1$, $S_2$, $S_3$, $S_4$ can be freely selected in accordance with the predetermined pulse patterns A, B, C, D, and the switching times $t_k$, $t_1$, $t_2$, $t_3$, $t_4$, $t_5$, $t_6$, $t_7$, $t_{k+1}$ can be freely used as well. This results in an independence from a fixed sampling rate, which leads to high dynamics and flexibility.

In the present embodiment, four pulse patterns A, B, C, D are defined on the selection unit 200. The pulse patterns A, B, C, D have a specific number of switching processes or switches from active periods to inactive periods or vice-versa per switching period $[t_k, t_{k+1}]$, i.e., here for example per prediction interval $T_P$. This means that each switching pulse $S_1$, $S_2$, $S_3$, $S_4$ switches only once from active to inactive and from inactive to active in a given switching period $[t_k, t_{k+1}]$. The power switches $S_{o1}$, $S_{o2}$, $S_{o3}$, $S_{o4}$, $S_{u1}$, $S_{u2}$, $S_{u3}$, $S_{u4}$ of the half bridges $HB_1$, $HB_2$, $H_{B3}$, $H_{B4}$ are controlled via the switching pulses $S_1$, $S_2$, $S_3$, $S_4$ in such a way that different phase currents $i_{L2}$, $i_{L3}$, $i_{L4}$ are generated in the chokes $L_1$, $L_2$, $L_3$, $L_4$. As mentioned, these phase currents $i_{L2}$, $i_{L3}$, $i_{L4}$ ultimately provide the current $i_1$ with which subsequently an output voltage $v_2$ and a load current $i_L$ are produced.

Figure 3A:
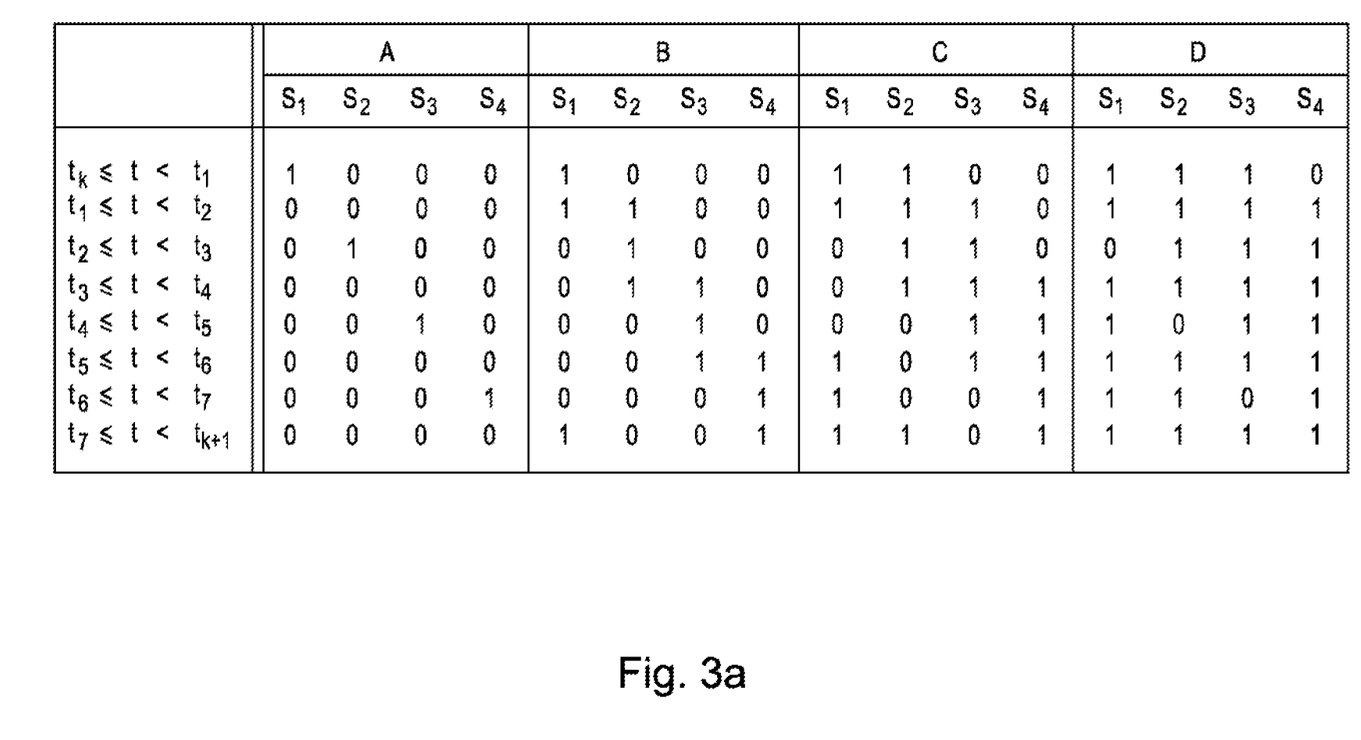
FIG. 3a shows a selection of pulse patterns.

FIG. 3a shows an exemplary selection of four pulse patterns A, B, C, D. The pulse pattern A has switching pulses $S_1$, $S_2$, $S_3$, $S_4$ in such a way that no active phase or at the most one active period occurs at the same time during a given phase. The pulse pattern B has switching pulses $S_1$, $S_2$, $S_3$, $S_4$ with one or two phases with simultaneously active periods, the pulse pattern C switching pulses $S_1$, $S_2$, $S_3$, $S_4$ with two or three phases with active periods and the pulse pattern D switching pulses $S_1$, $S_2$, $S_3$, $S_4$ with three or four phases with active periods. These pulse patterns A, B, C, D of the switching signals $S_1$, $S_2$, $S_3$, $S_4$, with which the power switches $S_{o1}$, $S_{o2}$, $S_{o3}$, $S_{o4}$, $S_{u1}$, $S_{u2}$, $S_{u3}$, $S_{u4}$ are controlled, are shown in a table in FIG. 3a. This results in a potential selection of output currents $i_1$ which can be achieved at the next sampling time $t_{k+1}$. The pulse patterns A, B, C, D allow for different output currents $i_1$ depending on the number of periods that are active at the same time. The pulse pattern D can, for example, potentially achieve a greater output current $i_1$ than the pulse pattern A. The PPPC controller 201 thus estimates which of these pulse patterns A, B, C, D provided by the selection unit 200 must be selected with which switching times $t_k$, $t_1$, $t_2$, $t_3$, $t_4$, $t_5$, $t_6$, $t_7$, $t_{k+1}$ in order to minimize the deviation of the generated current $i_1$ from the current $i_1^*$ specified by the voltage controller VR given at the next sampling time $t_{k+1}$.

Only a pulse pattern A, B, C, D can generally be selected, for example, that approximates the generated output current $i_1$ to the current $i_1^*$ specified by the voltage controller VR, i.e., whose possible value range (which is specified by the different possible switching times $t_k$, $t_1$, $t_2$, $t_3$, $t_4$, $t_5$, $t_6$, $t_7$, $t_{k+1}$) contains the specified current $i_1^*$. Furthermore, there is an additional degree of freedom with respect to the switching times $t_k$, $t_1$, $t_2$, $t_3$, $t_4$, $t_5$, $t_6$, $t_7$, $t_{k+1}$ in order to set the output current $i_1$ at the time $t_{k+1}$. To determine the switching times $t_k$, $t_1$, $t_2$, $t_3$, $t_4$, $t_5$, $t_6$, $t_7$, $t_{k+1}$ for the selected pulse patterns A, B, C, D, an optimization problem can be posed to determine the optimal switching times $t_k$, $t_1$, $t_2$, $t_3$, $t_4$, $t_5$, $t_6$, $t_7$, $t_k+1$ for the given output current $i_1^*$. For this purpose, a cost function $J_K$ as a function of the j switching times and the output current $i_1$, and possibly other variables, can be applied, i.e., $J_K = f(t_j, i_1^*, \ldots)$. This cost function $J_K$ evaluates the deviation of the assigned output current $i_1^*$ and of the generated output current $i_1$ and may with regard to the switching times $t_1$, $t_2$, $t_3$, $t_4$, $t_5$, $t_6$, $t_7$ (with $t_k$, $t_{k+1}$ being specified and unchangeable) be optimized, usually minimized, i.e., $t=\mathrm{argmin}|_t J_K$, with the switching time vector t, which contains the j switching times. For this purpose, a suitable termination criterion can be determined, for example when a deviation threshold or a number of iterations is not achieved. This results in an optimal approximation of the given output current $i_1^*$ by the pulse pattern A, B, C, D.

Figure 3B:
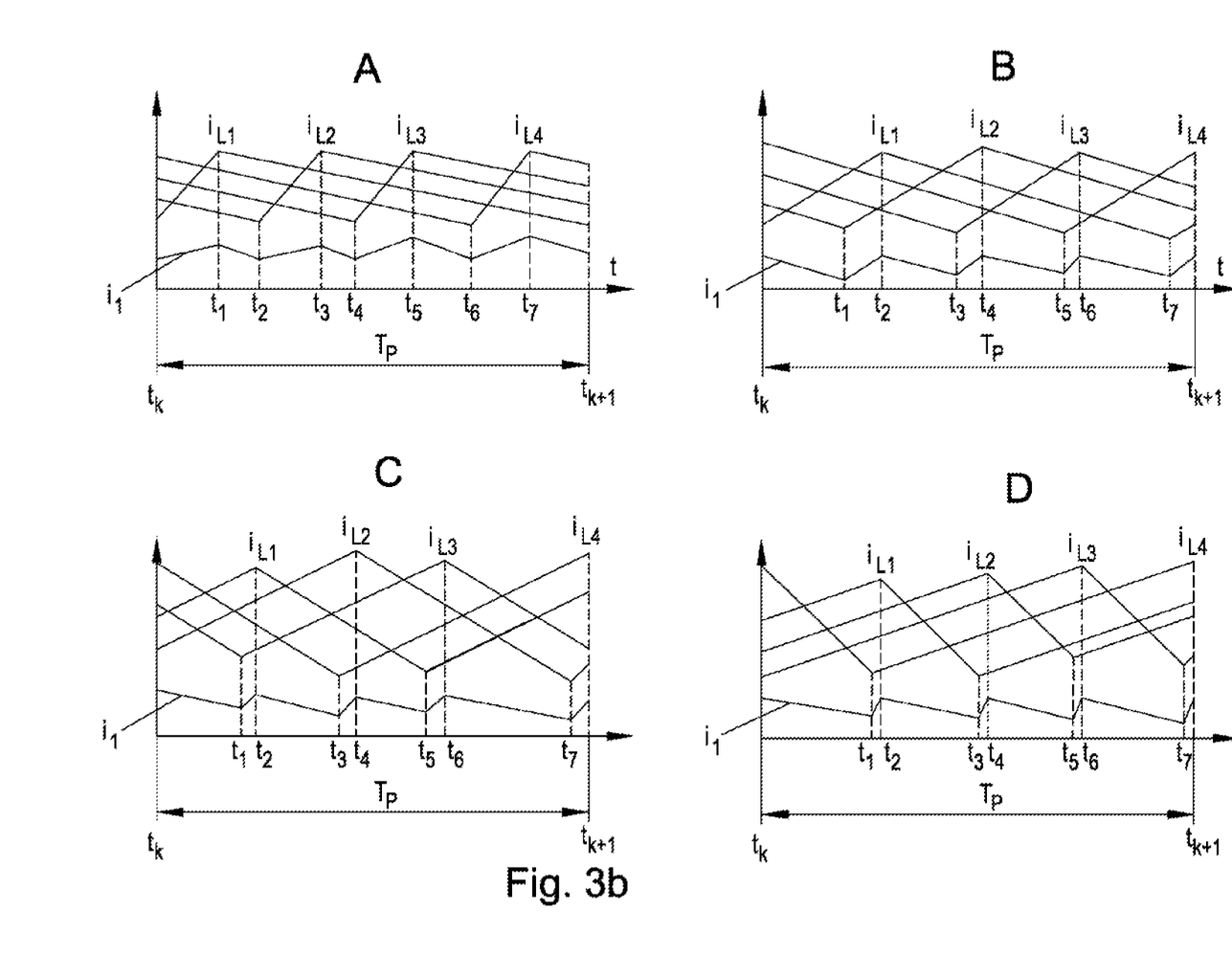
FIG. 3b shows values of the phase currents estimated from them.

FIG. 3b shows the estimated phase currents $i_{L1}$, $i_{L2}$, $i_{L3}$, $i_{L4}$ on the basis of the pulse patterns A, B, C, D and the switching times $t_k$, $t_1$, $t_2$, $t_3$, $t_4$, $t_5$, $t_6$, $t_7$, $t_k+1$ and the resulting estimated output current $i_1$. The different switching times $t_1$, $t_2$, $t_3$, $t_4$, $t_5$, $t_6$, $t_7$ are shown.

By selecting the pulse patterns A, B, C, D and the associated switching times $t_1$, $t_2$, $t_3$, $t_4$, $t_5$, $t_6$, $t_7$, $t_{k+1}$, the PPPC controller can, in contrast with a customary FCS-MPC, estimate the expected values of the phase currents $i_{L1}$, $i_{L2}$, $i_{L3}$, $i_{L4}$ with variable switching times $t_1$, $t_2$, $t_3$, $t_4$, $t_5$, $t_6$, $t_7$. On the basis of this estimate, the switching signals $S_1$, $S_2$, $S_3$, $S_4$ that minimize an expected error can be generated, which leads to higher accuracy and dynamics.

The invention claimed is:

1. An energy accumulator emulator comprising:
a DC-to-DC converter including a number of power switches, the DC-to-DC converter configured and arranged to provide an output voltage and an output-side load current;
a control unit configured and arranged to calculate a reference current from electrical variables of the DC-to-DC converter;
a battery model connected to the control unit and configured and arranged to obtain and process the reference current from the control unit and to provide the control unit with a reference voltage,
wherein the control unit includes a voltage controller configured and arranged to processes the reference voltage and controls a current, on a basis of which the control unit is further configured and arranged to control the power switches via switching pulses in order to control the output voltage; and
a Predictive Pulse Pattern Control Unit (PPPC unit) connected to the voltage controller, the PPPC unit including a PPPC controller, a pulse generator and a selection unit, the selection unit is configured and arranged to provide a number of pulse patterns, and the PPPC unit is configured and arranged to select a pulse pattern of the number of pulse patterns of the selection unit on a basis of a current predefined by the voltage controller and to control the power switches via the pulse generator by means of the switching pulses according to the selected pulse pattern.

2. The energy accumulator emulator of claim 1, wherein the PPPC controller is further configured and arranged to freely select the pulse pattern from the number of pulse patterns, thereby improving higher dynamics and accuracy in the control of the output voltage.

3. The energy accumulator emulator of claim 1, wherein the PPPC unit is further configured and arranged to select switching times of the selected pulse patterns of the power switches on a basis of a current.

4. The energy accumulator emulator of claim 1, wherein the DC-to-DC converter is a four-phase synchronous converter further including parallel half bridges and associated chokes, wherein a switching behavior of a half-bridge is configured and arranged to control a phase current of an associated one of the chokes.

5. The energy accumulator emulator of claim 4, wherein the half bridges of the DC-to-DC converter each include an upper power switch, a lower power switch and one or more freewheeling diodes.

6. The energy accumulator emulator of claim 5, wherein the upper and lower switches of a respective half bridge are configured and arranged to switch in an alternating order to prevent a short circuit.

7. The energy accumulator emulator of claim 4, wherein the sum of the phase currents at the chokes is the output-side load current.

8. The energy accumulator emulator of claim 4, wherein the control unit is further configured and arranged to receive string currents, the output-side load current, and the output voltage as input variables, and uses a combination of inner and outer control loops to control the output voltage.

9. The energy accumulator emulator of claim 8, wherein the outer control loop includes the voltage controller superimposed on an inner control loop which is formed by the PPPC unit, and the voltage controller is configured and arranged to
receive the reference voltage from the battery model and the output voltage and the output-side load current from the battery emulator, and
controls the current.

10. The energy accumulator emulator of claim 1, wherein each of the number of pulse patterns has a sequence of switching pulses that covers an entire possible range of the output voltage.

11. The energy accumulator emulator of claim 1, wherein each of the switching pulses switches only once from active to inactive and from inactive to active during a given switching period.

12. The energy accumulator emulator of claim 1, wherein a first pulse pattern of the number of pulse patterns includes switching pulses timed so that no active phase or at the most one active period occurs at the same time during a given phase, a second pulse pattern of the number of pulse patterns includes switching pulses with one or two phases with simultaneously active periods, a third pulse pattern of the number of pulse patterns includes switching pulses with two or three phases with simultaneously active periods, and a fourth pulse pattern of the number of pulse patterns includes switching pulses with three or four phases with simultaneously active periods.

13. The energy accumulator emulator of claim 1, wherein the PPPC controller is configured and arranged to estimate which of the number of pulse patterns provided by the selection unit should be selected, and corresponding switching times in order to minimize the deviation of the generated current from the current specified by the voltage controller at a next sampling time.

14. A method for emulation of an energy accumulator device comprising the steps of:
controlling output voltage of a DC-to-DC converter via a control unit;
calculating a reference current, at the control unit, from electrical variables of the DC-to-DC converter;
communicating the reference current to a battery model;
processing the reference current at the battery model;
calculating reference voltage from the reference current at the battery model;
transmitting the reference current from the battery model to a voltage controller;

processing the reference voltage at the voltage controller; and controlling a current (i1*) via the voltage controller, on a basis of which the control unit controls power switches via switching pulses to control the output voltage;

selecting a pulse pattern from a number of predefined pulse pattern on a basis of a current specified by the voltage controller via a Predictive Pulse Pattern Control Unit (PPPC unit); and controlling the power switches of the DC-to-DC converter according to the selected pulse pattern via the PPPC unit, and thereby controlling the output voltage.

15. The method according to claim 14, further including selecting switching times of the selected pulse patterns of the power switches on a basis of a current at the PPPC unit.

16. The method according to claim 14, further including supplying the output voltage to an electrical load.

* * * * *